| United States Patent [19]
Shidahara et al.

[11] Patent Number: 4,863,547
[45] Date of Patent: Sep. 5, 1989

[54] EQUIPMENT FOR HEATING AND COOLING SUBSTRATES FOR COATING PHOTO RESIST THERETO

[75] Inventors: Hitoshi Shidahara, Okayama; Syozi Yamamoto, Ibara, both of Japan

[73] Assignee: Tazmo Co., Ltd., Japan

[21] Appl. No.: 197,883

[22] Filed: May 24, 1988

[30] Foreign Application Priority Data
May 24, 1987 [JP] Japan .................. 62-126432

[51] Int. Cl.⁴ .................. B44C 1/22; B29C 37/00; B05D 3/06; B05C 11/02
[52] U.S. Cl. .................. 156/345; 118/101; 156/659.1; 156/668
[58] Field of Search .................. 156/345, 659.1, 661.1, 156/668, 311; 118/724, 725, 58, 59, 69, 101; 427/374.1, 398.1

[56] References Cited

U.S. PATENT DOCUMENTS 4,543,147  9/1985  Noto et al. .................. 156/311 X
4,717,645  1/1988  Kato et al. .................. 427/374.1 X Primary Examiner—William A. Powell
Attorney, Agent, or Firm—William A. Drucker

[57] ABSTRACT

Equipment for cooling semi-conductor substrates and printed circuit boards after coating photo resist thereon including heating the substrate for treatment. A heating block furnished with a heating plate is provided in a holding frame device on which the substrate is placed and is so mounted that the heating block can be elevated and lowered vertically therein. The heating block further includes a cooling block having a cooling plate which can be reciprocated from one open side of the holding frame device to the interior thereof, the cooling plate being vertically elevated and lowered in the holding frame equipment when the cooling block is in the holding frame device.

5 Claims, 4 Drawing Sheets

A

B

EQUIPMENT FOR HEATING AND COOLING SUBSTRATES FOR COATING PHOTO RESIST THERETO

BACKGROUND OF THE INVENTION

In an etching process in which photo resist is coated on a semi-conductor substrate, glass substrate and/or a printed circuit board, is dried and a required pattern is baked thereon, such substrate is washed, heated for drying in order to completely eliminate humidity (water content) on the surface of said substrate. Subsequently, said substrate is cooled down to the ambient (room) temperature for coating photo resist thereon.

If drying is insufficient, photo resist can not be firmly adhered to the surface of said substrate, thereby causing photo resist to be etched more than the required dimension or if photo resist is coated on said substrate whose temperature is still high with insufficient cooling, solvent for the photo resist may be partially vaporized, thereby causing the thickness of coating film to become uneven.

Phenomena like this must be absolutely avoided in etching semi-conductor substrates where a precision pattern is requisite.

Usually a hot air drying hearth, infrared rays irradiation methods or a hot plate is used for drying such substrates. In either method, the temperature of such substrates reaches 200° C. or more. So, it is necessary for them to be cooled down in a photo resist coating equipment to the ambient (room) temperature by spraying inactive gas such as nitrogen.

Taking treatment of semi-conductor substrates for instance, in order to continuously carry out this process, it takes about 20 seconds for said substrates to stay in the drying process and takes another 20 seconds in the coating process. Furthermore, it takes an additional 40 seconds in the cooling process by inactive gas in the coating equipment. For this reason, the staying time of said substrates in the coating equipment becomes longer by about 30 seconds to 40 seconds than that in the drying equipment. Therefore, the drying equipment is useless for these 30 to 40 seconds. Furthermore, dust which is carried out together with inactive gas like nitrogen may be adhered to said substrates which must be clean and free from any foreign substances, and the cooling treatment may become uneven, thereby causing the cooling temperature among said substrates to become uneven and the coating itself to be imbalanced. In addition, the consumption of inactive gas may be increased to such a degree that it can not be ignored.

Resist film coated in the above mentioned manner is baking-treated, and such substrates having this resist film are naturally cooled under atmospheric pressure at atmospheric temperature for 20 to 30 minutes. Subsequently, they are exposed to light with the required light exposure amount according to the resist on said substrates and furthermore they are subjected to developing and rinsing to a certain required specification, thereby causing a resist pattern to be formed.

With the conventional method mentioned above, it is very difficult to secure the uniformity of sensitivity in a very fine range with the same resist. Also as one-by-one resist sensitivity of substrates, may change and unevenness may occur inside said substrates even though the light exposure condition is constant, it is very difficult to form resist patterns with high precision among substrates and/or for the internal surface of a substrate.

On the other hand, there is a light CVD equipment as an example in which a light irradiation hearth is utilized. This is so composed that a wafer is placed on a table in a bell jar (or called "bell glass") and hot air is blown to said substrates from its lowerside so that said substrates can be heated up to 200° to 350° C. and that the vacuum degree is 0.2 Torr or 1 Torr in said bell jar. Furthermore, a gas like silane or silicon hydride ($SiH_4$), etc. is supplied in said bell jar and film formation on the upper surface of said substrates can be conducted through carrying out photo-chemical reaction on the surface of said substrate with such a relative gas as silane or silicon hydride ($SiH_4$) by irradiating light in the vertical direction from above said substrates.

However, as film formation goes further, inconvenience such as lowering the speed of film formation by disturbing the optical penetration at the inside of optical penetration window will occur. In this case, it is highly recommended that said substrates be treated in a short time by rapidly heating and rapidly cooling or quenching in order to avoid unnecessary film formation.

In the conventional system in which a heating equipment and a cooling equipment are installed below the table on which said substrate is placed, it is not possible to avoid a great loss of energy of excessive current as current is supplied and interrupted by turns at the power source of such heating and cooling equipments. In addition in said conventional system, unevenness of temperature is obliged to occur inside said substrates, and it is also impossible to keep the fluctuation of temperature within a reasonable fixed range for each of said substrates. Expecially, in order to coat photo resist on semiconductor substrates, for which extraordinary precision is indispensable, it is necessary to control the temperature fluctuation within a reasonable fixed range by using an extra temperature regulating means and to lessen the unevenness among substrates. Therefore, the system itself may be obliged to become much more complicated and large. There are various problems in the conventional systems as shown in the above.

OBJECTS OF THE PRESENT INVENTION

One of the objects of this invention is to provide a novel equipment by which various defects, shown in the conventional system, in connection with heating and baking-treatment in conventional photo resist coating equipment are minimized and light CDV equipment.

Namely, in a system disclosed by the present invention, a heating block furnished with heating plate can be elevated and lowered in the holding frame equipment on which a substrate is placed, and on the other hand a cooling equipment furnished with cooling plate can be reciprocated through one open side of said holding frame equipment toward the inside thereof, thereby causing said substrate to be able to be cooled down at the same position after being heated. Namely, there is no need to move said substrate. Therefore, various problems of the conventional systems, e.g., generation of dust in the conveying system and contamination of said substrates thereby, can be completely solved. Furthermore, said substrates can be free from any damage in transit from equipment one to another equipment. Besides, it is possible to conduct photo-chemical reaction by making the equipment vacuous.

Moreover, both said heating equipment and said cooling equipment are adjusted to a certain required temperature level, thereby causing instantaneous power not to be required when turning on and off the power thereof. Rapid heating and rapid cooling can be secured by decreasing the thermal capacity of a substrate placing plate. Namely it ensures a very high energy saving effect.

This equipment disclosed by the present invention ensures that each treatment like coating, heating, cooling, etc. is uniformly conducted and that the repeatability (or re-appearance) is very accurate. Moreover, warm-up (or stand-by) time for heating temperature and cooling temperature can be much shortened, and it is possible to coat photo resist in very high precision. These and other objects can be made much more apparent by referring to the following description and making reference to the drawings attached hereto.

DESCRIPTION OF THE PREFERRED EMBODIMENT

A substrate is indicated at "1", and a holding frame equipment is indicated at "2", at which said substrate is placed. A heating block "3" furnished with heating plate can be elevated and lowered in said holding frame equipment "2" and a cooling block "5"is provided in said holding frame equipment and is equipped with a cooling plate which can be horizontally reciprocated through one open side of said holding frame equipment and can be elevated and lowered therein.

The following description deals with one of the detailed embodiments of the present invention.

A holding frame equipment "2" on which a substrate "1"is placed consists of four support columns "2b" which are installed on the base "6" and stand with an equal fixed height thereon. A substrate placing plate "2a is horizontally fixed at the top of said four support columns "2b".

Figure 1:
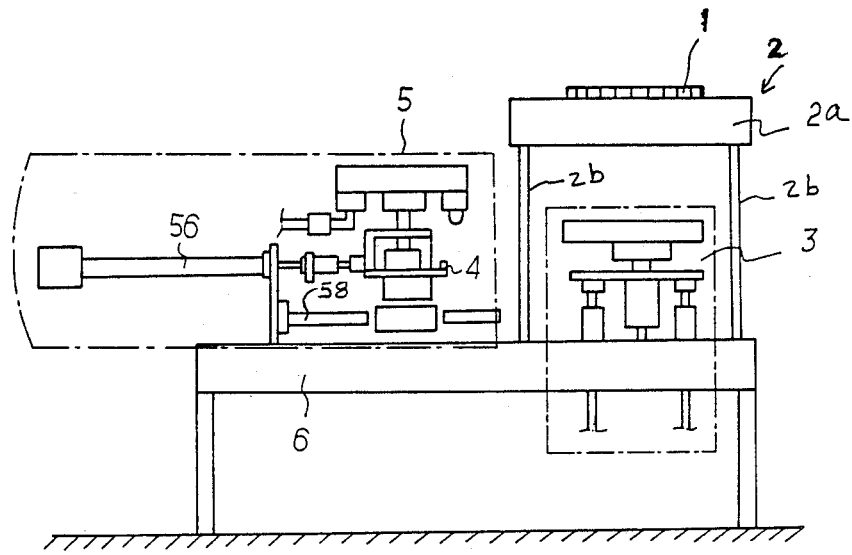
FIG. 1 is a rough front elevation view of the whole equipment disclosed by the present invention.
Figure 4:
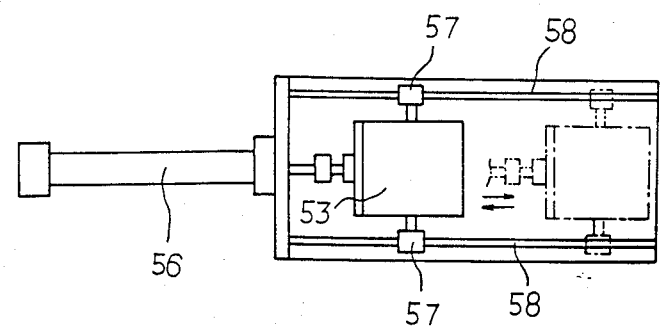
FIG. 4 is a view for explaining the operation of said cooling block.
Figure 2:
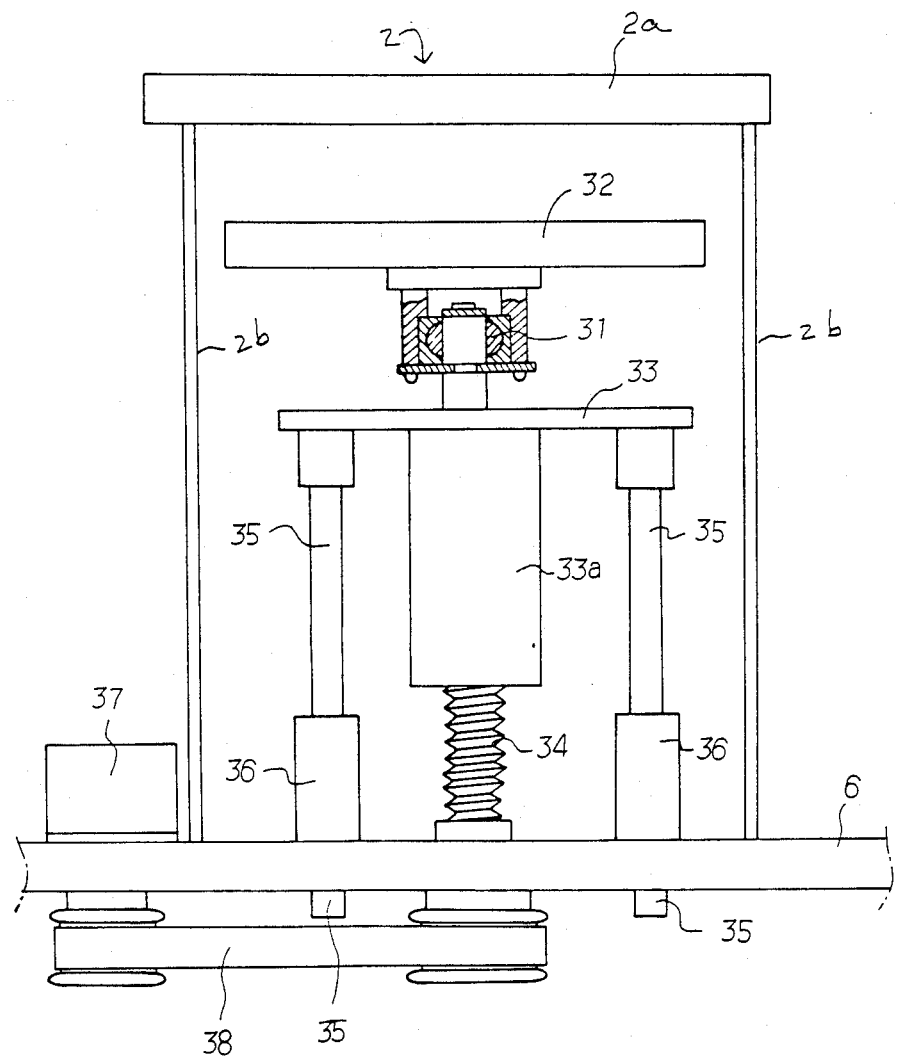
FIG. 2 is a partially sectional front elevation view of the heating block adopted in this equipment.

A heating block "3" is so composed that said heating plate "32" can be brought into proximity or contact with the underside of said plate "2a" on said base "6" in said holding frame equipment "2", and this construction is shown in FIG. 2.

Said heating plate is indicated at "32", and said heating plate "32" is fixed at said heating plate fixing plate "33" by means of a spherical bushing "31" which can be freely rotatable, in order to secure reliable contact between said heating plate "32" and said placing plate "2a"of said substrate "1". A boss "33a" is mounted at the central lower side of this heating plate fixing plate "33" and is engaged with a screw shaft "34" which is rotatably installed on said base "6". Two or four guide rods are installed outside thereof. At this time, Said guide rods are inserted in guide cylinder "36" which are fixed at said base "6", and they can be elevated and lowered together with rotation of said screw shaft "34".

A stepping motor "37" is fixed at one end of said base "6" and can rotate said screw shaft by means of a belt "38", thereby causing said heating plate fixing plate "33" to be elevated and lowered. Therefore, said heating plate "32" which is heated in advance is brought into proximity or contact with said substrate placing plate "2a" by elevation of said heating plate fixing plate "32" thereby causing heat to be transmitted. At this time, said heating plate "32" is heated to a required temperature level, thereby causing said substrate "1" to be heated up to a desired level of temperature. Hence, it is very easy to adjust the heating time by controlling the time of contacting between said heating plate "32" and said placing plate "2a" at any option. Besides, it is easily possible to change the characteristics of warm-up (or stand-by) of heating by adjusting the distance between said placing plate "2a" and said heating plate "32".

As soon as required heating is completed as shown in the above, said stepping motor rotates reversely, thereby causing said heating block "3" to be lowered. Then, it waits for a subsequent heating process at its initial low position.

Figure 3:
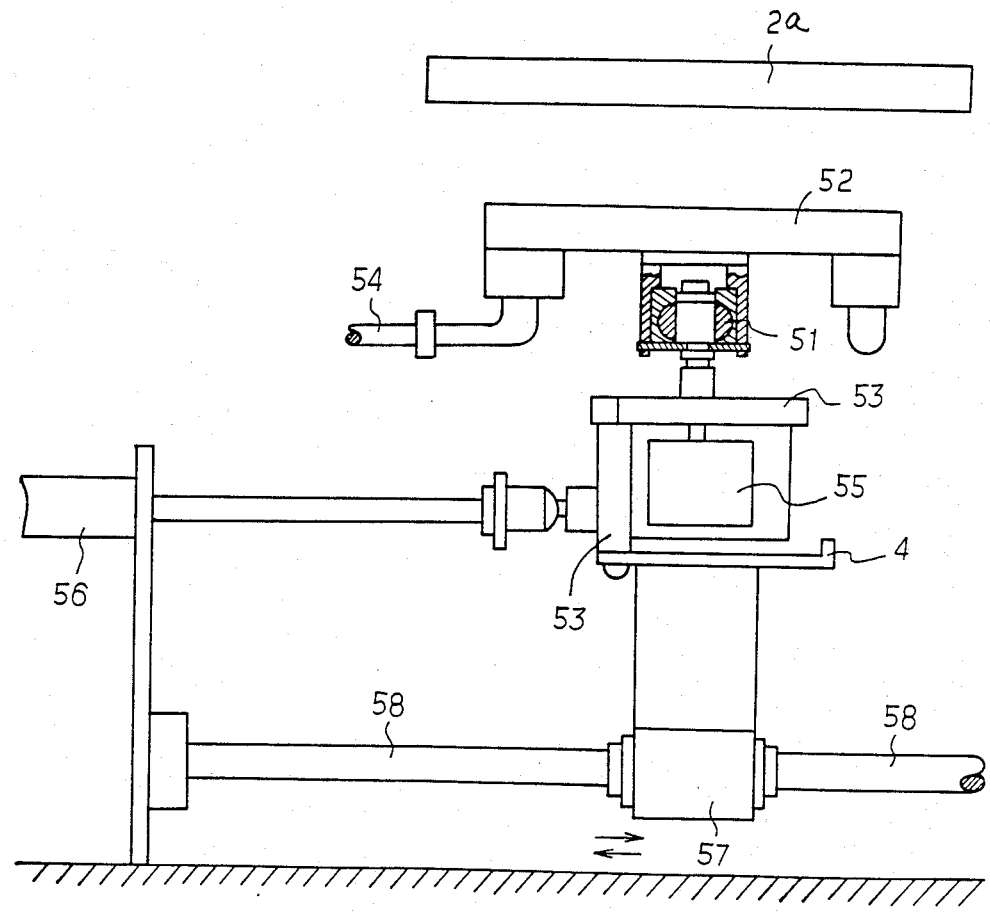
FIG. 3 is a partially sectional front elevation view of the cooling block adopted in the equipment.

Next, the construction of a cooling block "5" is explained in reference with FIG. 3.

A cooling plate "52" is mounted a cooling plate fixing base "53" by means of a spherical bushing "51" to secure reliable contact with a substrate placing plate "2" as well as said heating plate "32", and said cooling plate "52" is provided with a refrigerant tube "54" through which a refrigerant like water or cooling air can be circulated.

A drive device "55" is installed at the lower part of said cooling plate fixing base "53" in order to vertically operate said spherical bushing "51". Said drive device may be of a motor-driven screw shaft system or a hydraulic cylinder. Besides, said drive device "55" is furnished with a radiation heat prevention shutter "4" at the lower part thereof in order to protect said cooling block "5" from radiation heat at said heating block "3".

One end of said cooling block "5" so composed as shown in the above is linked with a horizontal slide drive means "56" which is of a screw shaft system driven by a hydraulic cylinder or an electric motor, and the lower part of said cooling block "5" is furnished with a sliding member "57" and guide rails "58". So, said cooling block "5" can be reciprocated from one open side of said holding frame equipment "2" to inwards of said equipment "2".

When cooling said substrate "1", said cooling block "5" is moved horizontally up to the lower side of said placing plate "2" by means of said horizontal slide drive means "56", and said cooling plate "52" is elevated by a vertical slide drive means "55" which is installed at said cooling plate fixing base "53" of said block "5", thereby causing said cooling plate "52" to be brought into proximity or contact with said the lower side of said placing plate "2".

As said cooling plate "52" is cooled by refrigerant in advance, said substrate "1" on said placing plate "2" can be rapidly cooled down or quenched to a desired level of temperature.

At this time, it is possible to set up the cooling-down characteristics and cooling time at any option by controlling the distance and the time of contacting between said placing plate "2" and said cooling plate "52".

Like this, on completion of cooling treatment, said cooling plate "52" is immediately lowered and said cooling block "5" can be returned to its original position by said horizontal slide drive means "56". Hence, this cooling block waits for a subsequent cooling process at its original position.

Figure 5:
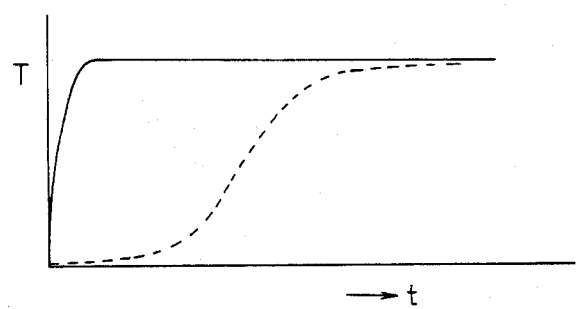
FIG. 5 A and B are a linear diagram showing the warmingup of heating temperature and a descending condition of cooling temperature, and the solid lines therein show the case of the equipment disclosed by the present invention and the dot lines thereof shows the case of conventional systems.
Figure 5:
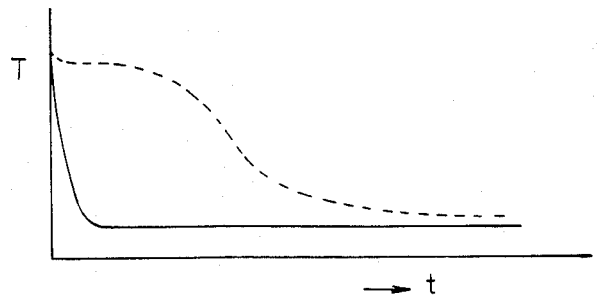

FIGS. 5A and 5B are a linear diagram, "A" of which shows warm-up of the heating temperature when the equipment disclosed by the present invention is used, and "B" of which is a cool-down state of the cooling temperature when said equipment is used. (In these linear diagrams, the solid lines are for the case of the present invention, and the dot lines are for the cases of conventional equipments).

As made apparent by these drawings attached hereto, as stand-by (or warm-up) of heating temperature and cooldown of cooling temperature can be much shortened, it becomes possible to coat photo resist at much higher precision. At the same time, this equipment disclosed by the present invention can greatly contribute to promoting the quality and the productivity of substrates intended for semi-conductors and printed circuit boards. We claim;

1. A heat treatment equipment for substrates comprising:
   (a) a holding frame for holding substrates in a horizontal plane;
   (b) heating means disposed beneath said holding frame, said heating means including a temperature elevating member and means to reciprocally move said temperature elevating member toward and away from said holding frame in a vertical direction; and
   (c) cooling means disposed beneath said holding frame, said cooling means including a temperature lowering member, means to reciprocally move said temperature lowering member toward and away from said holding frame in a direction parallel to said horizontal plane and normal to said first predetermined direction and means to reciprocally move said temperature lowering member toward and away from said holding frame in a vertical direction.

2. A heat treatment equipment as set forth in claim 1 further including a spherical bushing supporting said heat producing member.

3. A heat treatment equipment as set forth in claim 1 further including a spherical bushing supporting said temperature lowering member.

4. A heat treatment equipment as set forth in claim 1 wherein said holding frame includes plural support columns supporting said holding frame in a fixed position.

5. A heat treatment equipment as set forth in claim 4 wherein said cooling means comprises a guide rail for guiding said temperature lowering member and said means to reciprocally move said temperature lowering member is a screw shaft, said cooling means further including a shutter as its underside to prevent heat radiation thereto from said heating means.

* * * * *